United States Patent [19]

Fennel

[11] Patent Number: 4,615,113
[45] Date of Patent: Oct. 7, 1986

[54] PILFER PROOFING SYSTEM AND METHOD FOR ELECTRIC UTILITY METER BOX

[76] Inventor: Robert B. Fennel, 241 Deerfield Rd., Bloomingdale, Ga. 31302

[21] Appl. No.: 694,368

[22] Filed: Jan. 24, 1985

Related U.S. Application Data

[62] Division of Ser. No. 526,236, Aug. 25, 1983, Pat. No. 4,505,530.

[51] Int. Cl.⁴ .................. H01R 43/00; H01R 13/44
[52] U.S. Cl. ................................. 29/874; 29/401.1; 29/428; 29/462; 29/469; 174/5 R; 174/50; 339/38
[58] Field of Search .............. 29/401.1, 428, 462, 29/469, 874, 876; 174/5 R, 50, 52 R, 58; 339/38, 154 R, 154 A, 156 R, 156 T, 157 R, 164 R, 164 M, 166 R, 166 T, 170

[56] References Cited

U.S. PATENT DOCUMENTS

| 3,744,010 | 7/1973 | Meacham | 339/157 R |
| 4,090,769 | 5/1978 | Damsky | 339/156 R |
| 4,180,303 | 12/1979 | Damsky | 339/156 R X |
| 4,509,258 | 4/1985 | Locati et al. | 29/876 |

FOREIGN PATENT DOCUMENTS

| 1034975 | 10/1953 | France | 339/156 R |
| 212377 | 3/1924 | United Kingdom | 339/170 |
| 355201 | 2/1930 | United Kingdom | 339/170 |

Primary Examiner—Mark Rosenbaum
Assistant Examiner—Ronald S. Wallace
Attorney, Agent, or Firm—Jim Zegeer

[57] ABSTRACT

A pilfer proofing system and method for electric meter boxes having a meter base box, which carries a plug-in terminal block set and a meter box cover having an opening through which a plug-in-meter passes to engage contact jaws or sockets the terminal block set. An anchoring bar is secured to the meter stops and a conventional meter locking collar is secured to the cover and the bridge of the locking collar is secured to the anchoring bar. Metal extension adaptors are secured to the meter blades for entering into the contact jaws or sockets of the terminal block set and a conventional locking ring is utilized to lock the meter in place on the added meter collar thereby providing a substantial obstacle to easy pilfering of electricity. A safety device constituted by a handle, a flexible insulating sheet and a set of nonconductive blades is inserted in the socket blades of the terminal block set and retained therein by friction covering up the hot or live terminals of the terminal block set with the flexible insulating sheet, and it is removed by grasping the handle and removing same.

2 Claims, 4 Drawing Figures

PILFER PROOFING SYSTEM AND METHOD FOR ELECTRIC UTILITY METER BOX

BACKGROUND OF THE INVENTION AND PRIOR ART STATEMENT

This is a divisional of application Ser. No. 526,236, filed Aug. 25, 1983, now U.S. Pat. No. 4,505,530.

Pilfering of electricity by tampering with the meter and meter box has always been a problem for electric utilities but with the advent of significant increases in the cost of electrical energy, there has been a significant increase in the pilferage of electricity by tampering with electric utility meters, particularly those types of meters having boxes in which the cover is moveable relative to the meter itself and a sealslide fastener type securement is used. These can be characterized as ringless meter boxes and the invention is particularly directed to pilfer proofing this ringless type of meter box. Neilson Pat. No. 4,144,729 discloses an electric meter box lock in which the cover of a ringless electric meter box is locked by use of a bolt type lock which prevents access through a screw which fixes the holding part down to the cover and a bracket fixed on the body of the device. Young Pat. No. 2,242,637 discloses a meter cover and locking ring. In Mylius Pat. No. 2,071,936, a similar structure is disclosed but there, the bridge of the socket member supports the contact assemblies. The bridge is secured to a pair of angles which are welded to the housing channel member. In Kuhn Pat. No. 2,206,408 threaded bosses in the base of the housing receive long screws which pass through the bridge 10 and thereby secure the one piece cover 12 in place so that the meter socket can thereby receive the meter which is secured in place by a conventional locking ring. Janson Pat. No. 2,742,173 and Lajeuness et al Pat. No. 2,695,923, relate to socket meter boxes in which the bridge has been eliminated and access is by way of an internal latch. Others such as Campbell Pat. No. 2,162,548 and Lundberg Pat. No. 4,049,313 relate to various locking arrangements. Isen et al Pat. No. 3,968,985, Neilsen Pat. No. 4,058,992 Morse Pat. No. 3,714,802, Morse et al Pat. No. 3,967,882 and Hoyt Pat. No. 3,835,674 all relate to locking ring structures which can be used in the system of this invention.

However, for the most part, these prior art structures do not appear to be directed to adjusting or converting existing and/or energized ringless meter boxes to ring lock type meter boxes which provide much more difficult access without a proper key to the lock on the ring.

Briefly described, the basic obJective of this invention is to adapt installed non-ring lock meter sockets to ring lock meter sockets and make it much more difficult for certain consumers to steal electricity by by-passing the meter. This is achieved by fastening a bar of steel to the opposed meter stops of an installed ringless meter box and a conventional meter stop collar is formed on or secured to the cover of the meter with the meter collar stop projecting through the opening of the cover. The meter stop collar has a bridge extending diametrically across the opening and screw holes in the bridge aligned with threaded screw holes in the locking bar which has been fastened to the meter stops of the old meter box. Since the meter will be spaced by the spacing of the meter collar that has been added, metal extension male-female adaptors on a common insulated carrier enter into the blade sockets in the terminal block set that is secured to the housing and the insulated carrier is secured to the cross bar. The meter, with its contact blades in the base thereof is plugged into the male contact jaws of the extension adaptors and, a conventional locking ring of the type referred to above, is utilized to lock the meter in place on the newly added meter collar.

Since the meter box cover is now fastened, via the bridge, screws and bar, to the meter existing meter stops inside the housing, the only way to get access to the interior of the box is by breaking the locking ring; all fastening screws and the like are within the interior of the thus modified meter box thereby making it more difficult to pilfer electricity.

In as much as the invention is primarily directed to adapting existing ringless type meter boxes to the locking ring type meter boxes without disconnecting the box from the incoming power lines, a unique safety device is provided which prevents the installer from contacting the live electrical terminals. This includes non-conductive blades secured to a handle and a flexible rubber sheet secured thereto so that when the insulated blades are plugged into the upper ones of the meter box socket, the flexible insulating sheet drapes down over the lower pair of socket blades. Thus, the invention takes the place of several different kinds of locks. A serviceman only has to have a locking band and the conversion kit if the meter box has meter stops. With the meter conversion, (which preferably are made up in advance) at hand the serviceman only has to install the cross bar on the meter stops, and in the disclosed embodiment this entails the drilling of two small holes in meter stops, to install the conversion kit. Also if, the hasp used for sealing the meter box is torn up, it will not have to be replaced because the seal can be put on the locking band. The locking band is a lock that is very difficult to tear up, or break into. So the invention makes it possible to put this locking band on all boxes with meter stops.

BRIEF DESCRIPTION OF THE DRAWINGS

The above and other objects advantages and features of the invention will become more apparent from the following specification taken in conjunction with the accompanying drawings wherein.

DETAILED DESCRIPTION OF THE INVENTION

Figure 1:
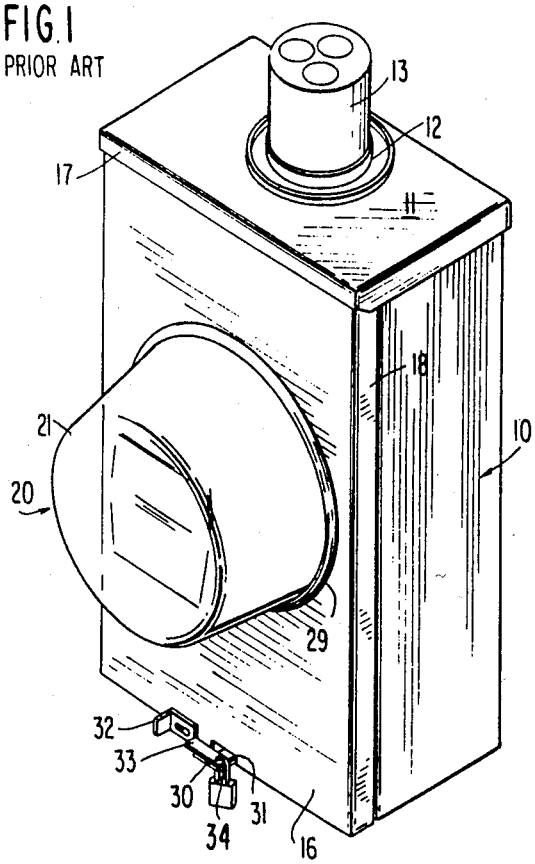
FIG. 1 is an isometric view of a prior art ringless plug-in meter box which is to be pilfer proofed according to the invention.

There are many different kinds of meter boxes for metering electric usage in homes, business and commercial establishments and the like and the one to which the present invention has particular utility is illustrated in FIG. 1. As indicated above this may be characterized as a ringless plug-in meter box and is constituted by a meter box 10 having a bottom (not shown) right 11R and left 11L side walls and top 11T and bottom walls 11B, the top wall 11T has an box connector 12 secured thereto through which passes the service entrance cable 13 which, in turn, is secured to the service drop conductors from the power line in a conventional fashion. The bottom end wall (not shown) has a service cable which goes through a box connector (not shown) to the interior of the unit and is the load side of the meter, and typically these may comprise three conductors two of which are line or energized conductors and the third conductor of which is a neutral or common. In a typical dwelling, for example, there is 220 volts between the line conductors and 110 volts between each line conductor and the common or neutral conductor. An important feature of the invention is that the pilfer proofing of the meter box can be accomplished without removing the meter box from the line that is, while the meter box is energized and there is power on the line conductors.

Figure 3:
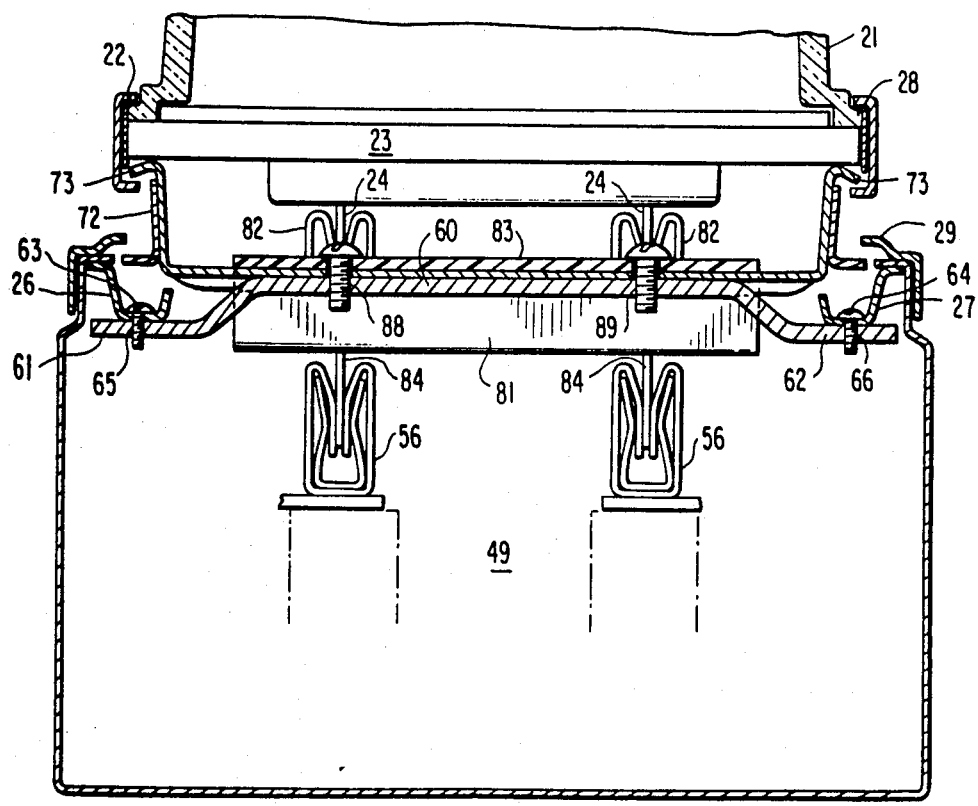
FIG. 3 is a sectional view through the crossbar shown in FIG. 2.

Meter box 10 is provided with a cover 16, the upper edge 16U of cover 16 sliding under a peripheral flange 17 on top end 11T of meter box 10 and the depending flanges or skirts 18 of cover 16 fit over and close off the edges of the two side walls and bottom wall of the enclosure. Prior to fitting closure plate 16 onto the meter box 10, a meter unit 20, which has rearwardly projecting contact blades 24, is plugged into the contact jaws 56,57 in the terminal block set 49 of the meter box thereby completing the electrical circuit between the service entrance cable 13 and the contact jaws 56 connected thereto and the contact jaws 57 connected to the service cable on the load side of the meter box. As shown in FIG. 3, meter 20 has a glass cover 21 which is secured by a metal ring 22 to meter base 23 from which project the contact blades 24. Meter 20, with its projecting contact blades 24, is simply plugged into the upper and lower contact jaws 56,57 of the terminal block set 49. A pair of meter stops 26 and 27 secured to the side walls of meter box 10. An annular shoulder 28 is formed at the base of glass cover 21. A corresponding raised flange 29 is formed on cover 16 so that when the cover 16 is fitted on box 10, glass meter cover 21 projects through the opening bounded by flange 29 and engages shoulder 28 to thereby retain meter 20 in place. A tongue 30 secured to the bottom wall of meter box 10 projects through a slot 31 to cover 16. A slide 32 secured to cover 16 has a projecting tongue 33 which has an aperture 34 which aligns with an aperture 35 in tongue 30. Slide 32 is positioned so that the two apertures 34 and 35 align and a safety seal (not shown) is used to provide an indication of tampering.

In the past, those electric utility customers who have a proclivity to pilfer electricity have found it very easy to tamper with the safety seal (making it appear as if no tampering had taken place or easily disclaiming responsibility for the tampering) and easily gain access to the meter and tamper with same in various ways so as to bypass the meter and thereby inaccurately portray their actual electricity usage.

Figure 4:
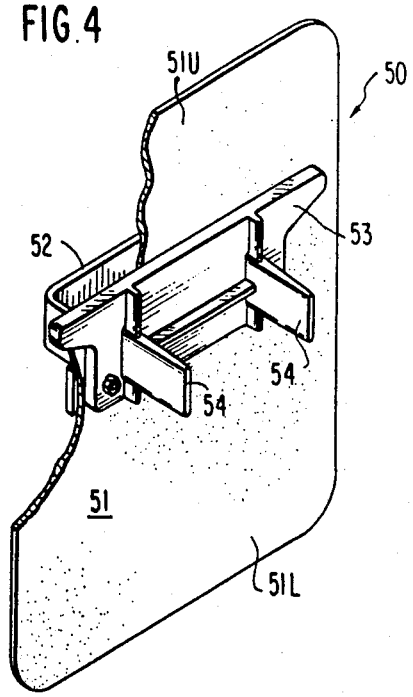
FIG. 4 is an isometric view of a safety shield according to the invention.
Figure 2:
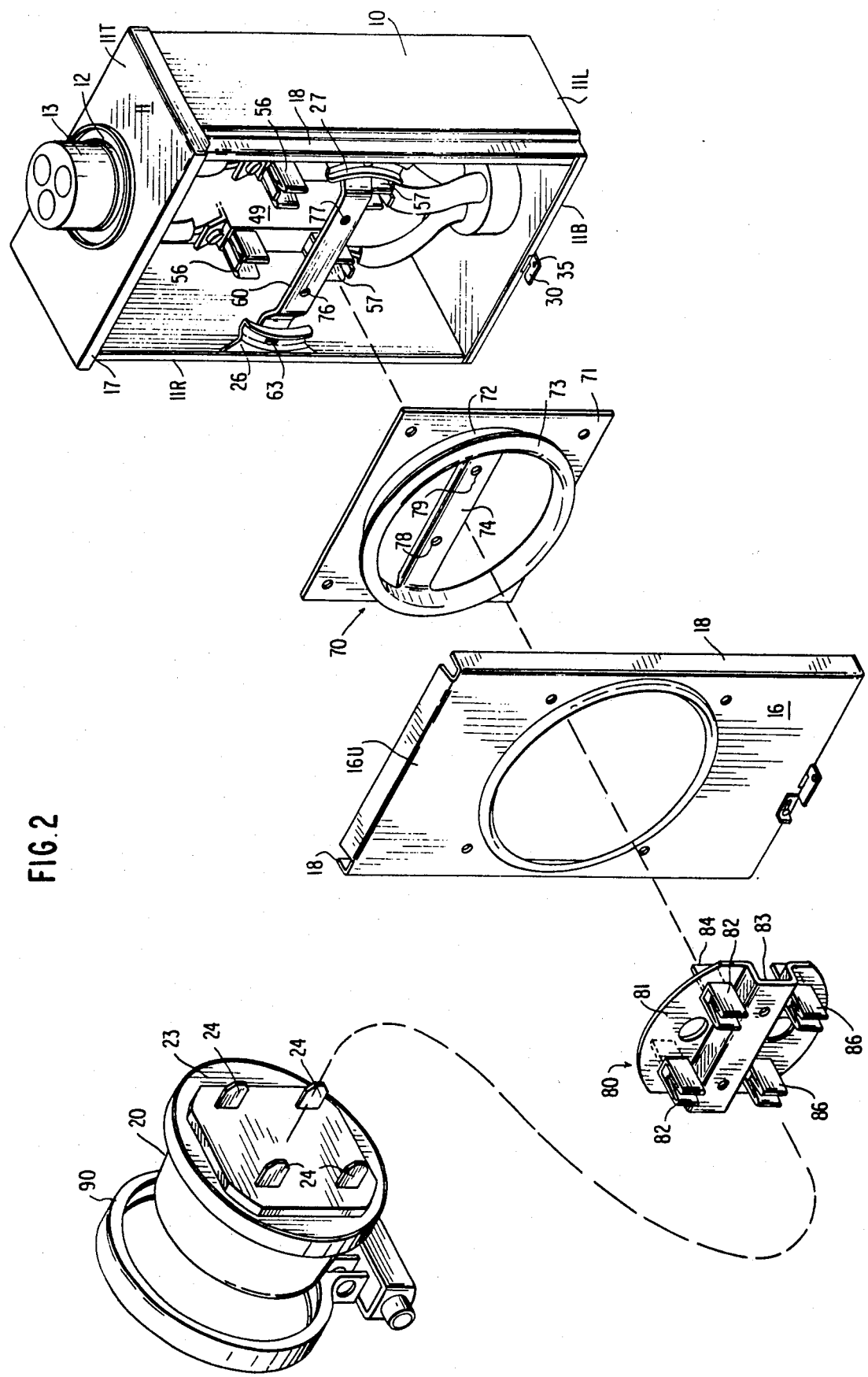
FIG. 2 is an exploded perspective view of a pilfer roofed meter box incorporating the invention.

According to the present invention, the electric meter box shown in FIG. 1 is made pilfer proof by converting the meter from a ringless plug-in meter to one which has a locking ring which positively locks the meter in place without any easy access thereto by those having a propensity to pilfer electricity from the utility. The invention is illustrated in the exploded perspective view shown in FIG. 2, and sectional view through the cross bar shown in FIG. 3. To begin the pilfer proofing, the cover 16 and meter 20 shown in FIG. 1 are removed and safety shield 50 is applied to the contact terminal block set 49. The safety shield 50, shown in detail in FIG. 4, has a flexible rubber or other insulating member 51, an insulating handle 52 which is secured to or integrally formed with an insulating base 53 from which project contact jaw engaging insulated blades 54. Essentially all components of the safety shield are made of non-conductive or insulated materials either plastic or rubber or neoprene, and if desired, the handle 52 may be secured by rivots or screws to the base 53 which are integral with the contact jaw engaging insulated blades 54. In use, the safety shield 50 is plugged into the upper or hot contact jaws 56 of the meter box. The contact jaws are diagramatically illustrated as being connected to the conductors in the service entrance cable 13. The lower portion of body member 51 drapes over the lower contact jaws and the upper portion 51U extends upwardly to prevent contact with the service entrance cable conductors and at least all energized contacts, connector screws and fasteners etc . . . may be exposed. Thus, while the serviceman is installing the invention on the meter box he or she is protected from any electrical hazard.

A cross-bar 60, has a pair of offset lateral ends 61 and 62 which ends are secured by screws 63 and 64, respectively in threaded bores 65, 66 respectively of end 61,62 of cross-bar 60. These fasteners 63, 64 secure the cross-bar to the meter stops 26 and 27, respectively, and if its holes are not provided in the meter stops, they may be drilled, the safety shield protecting the serviceman from contacting the energized service entrance cable conductors, etc. . . .

Cover 16 which need not be the one removed from the meter box has secured thereto a locking flange assembly 70. Locking flange assembly 70 which may be constituted by one or several different parts, includes a base or securement plate 71, a cylindrical metal collar 72, annular locking flange 73 and cross bridge 74. In the disclosed embodiment, four holes are drilled in cover member 16 in alignment with similar aligned holes in securement plate 71. Four round or smooth headed bolts are used to secure the locking flange assembly to cover 16. It will be appreciated that instead of using cover 16 and adapting same to locking flange arrangement, a new cover could be shaped to be the equivalent of the combination of the locking flange assembly 70 and cover plate 16 without departing from the broader aspects of the invention. Moreover, instead of drilling holes in the meter stop 26, 27 flanges, the ends of the cross-bar could be complementarily shaped to engage and lock onto the meter stop flanges 26 and 27, respectively. That is to say, the offset ends 61 and 62 of the cross-bar could be fashioned to secure to meter stops 26 and 27 without the use of discrete fasteners, welding or the drilling of holes in the meter stops themselves.

After the locking flange assembly 70 has been secured to the cover 16 with the cylindrical collar 72 and flange 73 projecting therefrom, the cover is replaced. It will be noted that the cross-bar 72 is provided with a pair of tapped and threaded holes 76 and 77 which align with holes 78 and 79, respectively and. bridge 74. Locking flange 73 is adpated to engage the lower or rear surface of base 23 of meter 20 and takes the place of meter stops 26 and 27.

Since the meter base 23 will now be spaced somewhat from its normal position, the contact blades 24 on the meter will not reach the contact socket jaws of the blade sockets of the termina block set. According to the invention, a contact terminal block subset or adapter 80 is provided which is constituted by an insulated carrier member 81 and four contact jaw socket-blade units 82.

The insulated carrier member 81 is formed of an insulated material and has a U-shaped central portion 83 which adapted to fit over bridge 74 and cross-bar 60, portion 83 also having a pair of apertures 84 which are aligned with apertures 78 and 79 and the bridge 74 and threaded bore 76 and 77 in the cross-bar member 60. Each of the socket-blade elements are silver plated copper or otherwise good conductive members of similar conductivity to the blades contact blades extending from the rear of the meter and the terminal block set in the meter box 10. The rearwardly projecting contact blades 84 are the full equivalent of contact blades extending from the rear of the meter 20 and the sockets 86 are the full equivalent of the contact socket jaws in the terminal block set carried in the base of meter box 10. Since the safety shield 50 shown in FIG. 4 has been removed for the installation of the terminal block adaptor or subset 80, care must be taken when inserting and plugging the blades 84 in the contact jaws of the terminal block set secured to the base of meter box 10.

After the carrier has been plugged into the terminal block set, a pair of screws or fasteners 88-89 are used to secure the cover 16 which in turn is secured to securement plate 71 to the meter stops 26 and 27 via cross-bar 60. This assures that the cover can not be opened or dislodged from the exterior without visibly damaging the box itself thereby revealing an attempted pilfering. After the carrier 80 has been secured in place, the meter 20, with the rearwardly projecting contact plate can be plugged into contact jaws 86 of the carrier. When this is done, the base of the meter 20 should engage flange 73.

A locking ring or sealing band 90 is applied over the shoulder 22 on the glass cover and the locking flange 73 to thereby lock and seal the meter to the projecting collar 72 and flange 73. Thus, the meter can not be removed without a key and/or otherwise damaging the unit to gain access to meter and thereby pilfer electricity. The locking ring and its locking elements are conventional and fully disclosed in Mylius Pat. No. 2,071,936 and are commercially available from the Inertite Corporation as front entry meter locking rings. These include case hardened steel materials to resist cutting and hacksawing and, in addition to accepting pad locks and other types of hard locking devices also can accept lead wire safety seals and the like for soft forms of protection.

It will be appreciated that instead of a socket extension, a new meter could be provided with connector lugs (male blades) which have been made long enough to engage the sockets, or separate extensions may be provided for each meter blade which obviates the need of the contact extender assembly or subset 80. However, the embodiment shown in FIG. 2 wherein a carrier is provided for all of the contact blade and contact socket units is preferred since it expedites and speeds up the process of pilfer proofing a meter.

While there has been illustrated and described a preferred embodiment of the invention, it will be apparent to those skilled in the art that many modifications may be made without department from the spirit and scope of the invention as set forth in the following claims.

I claim:

1. A method of pilfer proofing a ringless plug-in type electric utility meter box having a contact terminal block set, and cover while it is still electrically connected to service entrance conductors from the electrical power line, comprising, removing the meter and cover, plugging insulating members into the energized contacts of said contact terminal block set, converting the cover of said meter box to a cover having flange and a meter locking collar, adapting said meter box for securement thereto of said meter locking collar and flange thereon, securing said meter locking collar to said meter box such that access to the interior of said meter box can only be had through said meter locking collar, removing said insulating members from the energized contacts of said contact terminal block, plugging the electric meter in said contact terminal block set in said meter box with the base of the meter engaging a surface of said meter locking collar flange, and securing a locking ring on the base of said meter and said meter locking collar flange.

2. The method of pilfer proofing a ringless plug-in type utility meter box while it is still electrically connected to service entrance conductors from the power line as defined in claim 1, further comprising extending the contacts in said contact terminal block set towards the outer cover of said electric utility meter box.

* * * * *